US009312382B2

(12) United States Patent
Gogoi

(10) Patent No.: US 9,312,382 B2
(45) Date of Patent: Apr. 12, 2016

(54) HIGH VOLTAGE TRANSISTOR DEVICE WITH REDUCED CHARACTERISTIC ON RESISTANCE

(71) Applicant: Empire Technology Development LLC, Wilmington, DE (US)

(72) Inventor: Bishnu Prasanna Gogoi, Scottsdale, AZ (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/338,217

(22) Filed: Jul. 22, 2014

(65) Prior Publication Data

US 2016/0027914 A1    Jan. 28, 2016

(51) Int. Cl.
*H01L 29/10*     (2006.01)
*H01L 29/66*     (2006.01)
*H01L 29/06*     (2006.01)
*H01L 29/78*     (2006.01)

(52) U.S. Cl.
CPC ........ *H01L 29/7827* (2013.01); *H01L 29/0657* (2013.01); *H01L 29/66666* (2013.01); *H01L 29/1095* (2013.01); *H01L 29/66712* (2013.01)

(58) Field of Classification Search
CPC ...................... H01L 29/1095; H01L 29/66712
See application file for complete search history.

(56) References Cited

U.S. PATENT DOCUMENTS

| 4,775,879 | A  | 10/1988 | Robb et al. |
| 6,593,619 | B1 | 7/2003  | Blanchard |
| 6,608,350 | B2 | 8/2003  | Kinzer et al. |
| 6,759,746 | B1 | 7/2004  | Davies |
| 7,176,524 | B2 | 2/2007  | Loechelt et al. |
| 7,704,842 | B2 * | 4/2010 | Blanchard ...................... 438/294 |
| 7,737,526 | B2 * | 6/2010 | Williams et al. ............... 257/506 |
| 7,821,064 | B2 * | 10/2010 | Rueb et al. ..................... 257/343 |
| 7,847,369 | B2 | 12/2010 | Davies |

(Continued)

FOREIGN PATENT DOCUMENTS

| EP | 2001049 A1 | 12/2008 |
| EP | 2339634 A2 | 6/2011 |

OTHER PUBLICATIONS

Deboy, G. et al., "A new generation of high voltage MOFETs breaks the limit line of silicon," Proceedings of IEDM, pp. 683-685 (1998).

(Continued)

*Primary Examiner* — Ida M Soward
(74) *Attorney, Agent, or Firm* — Turk IP Law, LLC

(57) ABSTRACT

Technologies are generally described for reduction of the characteristic on resistance for a transistor device. In some examples, a transistor device may include a source region, a drain region, an n-type epitaxial region between the source and drain regions, a p-type body region, and a deep p-type trench region formed below the body region. The trench region may be configured to charge compensate the n-type epitaxial region. In other examples, the characteristic on resistance may be reduced by replacing the silicon below the body region with lower resistance conductive material. A backside of a wafer that includes the transistor device may be thinned by using a support or carrier on the front side of the wafer to provide mechanical support, and etching trenches in both the substrate silicon and the epitaxial silicon located below the body region of the transistor device. The trenches may be subsequently filled with conductive material.

18 Claims, 11 Drawing Sheets

(56) References Cited

U.S. PATENT DOCUMENTS

| | | | |
|---|---|---|---|
| 7,898,057 B2 | 3/2011 | Davies et al. | |
| 7,989,886 B2 * | 8/2011 | Moens et al. | 257/330 |
| 8,334,579 B2 * | 12/2012 | Yeh et al. | 257/475 |
| 8,350,317 B2 | 1/2013 | Kocon | |
| 8,372,716 B2 | 2/2013 | Loechelt et al. | |
| 8,878,312 B2 * | 11/2014 | Hung et al. | 257/415 |
| 2004/0232486 A1 * | 11/2004 | Disney et al. | 257/342 |
| 2006/0170036 A1 * | 8/2006 | Yilmaz | H01L 29/0619 257/329 |
| 2007/0075362 A1 * | 4/2007 | Wu | H01L 29/66719 257/335 |
| 2009/0096021 A1 * | 4/2009 | Loechelt | H01L 21/761 257/341 |
| 2009/0108342 A1 * | 4/2009 | Wang | H01L 29/407 257/330 |
| 2009/0289291 A1 * | 11/2009 | Cheng | H01L 21/84 257/301 |
| 2011/0156217 A1 | 6/2011 | Kalnitsky et al. | |
| 2011/0291186 A1 * | 12/2011 | Yilmaz | H01L 29/4236 257/334 |
| 2012/0126313 A1 | 5/2012 | Braithwaite et al. | |
| 2012/0299102 A1 | 11/2012 | Lavoie et al. | |
| 2013/0069143 A1 * | 3/2013 | Yeh et al. | 257/330 |
| 2013/0299996 A1 * | 11/2013 | Grivna | H01L 29/407 257/774 |
| 2014/0045318 A1 * | 2/2014 | Parthasarathy et al. | 438/430 |
| 2014/0227837 A1 * | 8/2014 | Bobde et al. | 438/192 |
| 2014/0264573 A1 * | 9/2014 | Kocon et al. | 257/331 |
| 2014/0361362 A1 * | 12/2014 | Hsu et al. | 257/330 |
| 2015/0162336 A1 * | 6/2015 | Kim | H01L 27/10832 257/301 |
| 2015/0179750 A1 * | 6/2015 | Calafut | H01L 29/42368 438/270 |

OTHER PUBLICATIONS

Gogoi, B. et al., "New vertical silicon microwave power transistor structure and package with inherent thermal self protection," IEEE MTT-s International Microwave Symposium, Boston, Massachusetts, Jun. 7-12, 2009, pp. 569-572.

Lorenz, L. et al., "CoolMOS—a new milestone in a high voltage Power MOS," ISPSD, pp. 3-10 (1999).

* cited by examiner

HIGH VOLTAGE TRANSISTOR DEVICE WITH REDUCED CHARACTERISTIC ON RESISTANCE

BACKGROUND

Unless otherwise indicated herein, the materials described in this section are not prior art to the claims in this application and are not admitted to be prior art by inclusion in this section.

Vertical power transistor devices often have a high operational voltage observed across the source and drain terminals. The drain terminal for such power transistors is often located at a backside of the die, while the source terminal is often located at a top side of the die. For high breakdown voltages, vertical power transistors may require an increased thickness of the epitaxial layer and a reduced doping concentration of the epitaxial layer. The increase of the thickness and the reduction of the doping concentration may affect the characteristic on resistance (sometimes also referred to as series on resistance "RDSON") and also increase a size of the die for a specific characteristic on resistance, which in turn may increase the characteristic capacitance of the device due to the increased die area. For high voltage devices, the resistance of the epitaxial layer may be a major contributor to the overall characteristic ON resistance.

SUMMARY

The present disclosure is generally directed to high voltage transistor devices with reduced characteristic on resistance, and methods and systems of fabricating such devices.

According to some examples, a semiconductor device is described. An example semiconductor device may include a substrate having a top portion, a bottom portion, and a height; a body region of a selected type, where the body region is configured in contact with the top portion of the substrate; and a source region configured in contact with the body region. The semiconductor device may further include a drain terminal configured in contact with the bottom portion of the substrate and a trench region located below the body region in the bottom portion of the substrate, where sidewalls of the trench region are of the selected type, and where the sidewalls of the trench region are located substantially along the height of the substrate.

According to other examples, methods of fabricating a semiconductor device are described. An example method may include forming a body region in a substrate; forming a source region within the body region; forming a trench region located substantially within a portion of the source region and a portion of the body region; forming one of a p-type or n-type region in a portion of the sidewalls of the trench region within the body region; and/or sealing a neck section of the trench region substantially within the source region with a dielectric.

According to further examples, a semiconductor device is described. An example semiconductor device may include a substrate, an epitaxial layer configured in contact with a top portion of the substrate, a body region configured in contact with a top portion of the epitaxial layer, a source region within the body region, and/or two or more trench regions, where the trench regions are configured to be positioned through the substrate and a portion of the epitaxial layer, and where the trench regions are substantially aligned with the body region.

According to yet other examples, methods of fabricating a semiconductor device are described. An example method may include forming an epitaxial layer on a substrate; forming a body region in a top portion of the epitaxial layer; forming a source region within the body region; and/or forming two or more trench regions through the substrate and through a portion of the epitaxial layer such that the trench regions are substantially aligned with the body region.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
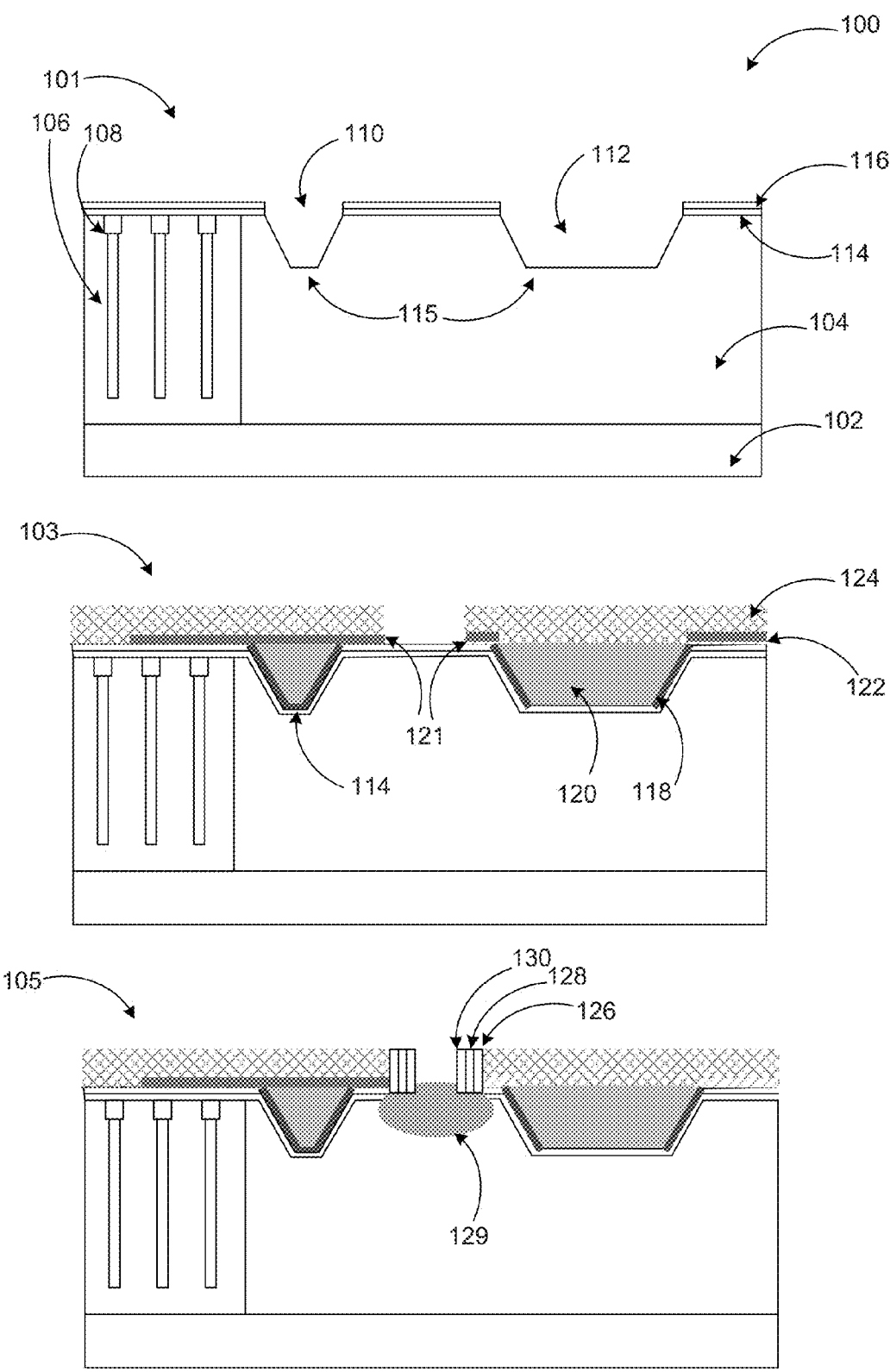
FIG. 1 illustrates side views of three phases in fabrication of an example transistor device with reduced characteristic on resistance.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to apparatus, devices, methods, and/or systems of fabrication related to high voltage transistor devices with reduced characteristic on resistance.

Briefly stated, technologies are generally described for reduction of the characteristic on resistance for a transistor device. In some examples, a transistor device may include a source region, a drain region, an n-type epitaxial region between the source and drain regions, a p-type body region, and a deep p-type trench region formed below the p-type body region. The p-type trench region may be configured to charge compensate the n-type epitaxial region. In other examples, the characteristic on resistance may be reduced by replacing the silicon below the body region with lower resistance conductive material. A backside of a wafer that includes the transistor device may be thinned by using a support or carrier on the front side of the wafer to provide mechanical support, and etching trenches in both the substrate silicon and the epitaxial silicon located below the body region of the transistor device. The trenches may be subsequently filled with conductive material employing a chemical vapor deposition (CVD) process or an electro-plating process using a seed layer. For the CVD process, materials such as tungsten may be used. For the electro-plating process, a metal such as copper may be used.

Although, references are made to one or more transistor devices that are on a wafer herein, additional variations may be contemplated and considered to be within the scope of disclosure. For example, the term die may be used interchangeably with the term wafer. Furthermore, the term substrate may also be used to have substantially same meaning as wafer in some configurations.

As discussed above, a deep p-type trench region may be formed below the p-type body, where the p-type trench is configured to charge compensate for the n-type epitaxial region between the source and the drain regions according to some embodiments. The p-type deep trench region may enable the depletion of the n-type epitaxial region with a lateral effect allowing the reduction in the thickness of the epitaxial region for a target breakdown voltage causing a subsequent reduction in the characteristic on-resistance. The reduction of the thickness and the characteristic on resistance may, in turn, enable the die size for a target characteristic on resistance to be appreciably smaller allowing the device to have lower device capacitances. A vertical power transistor device is used as an exemplary device for illustration purposes, embodiments may be implemented in lateral, discrete, and/or integrated transistor devices.

FIG. 1 illustrates side views of three phases in fabrication of an example transistor device with reduced characteristic on resistance, arranged in accordance with at least some embodiments described herein.

During the first phase of fabrication shown in the top portion 101 of diagram 100, a wafer comprising a substrate 102 and an epitaxial layer 104 on the substrate 102 may include field termination trenches 106, which may be sealed (108). A pad oxide layer 114 may be grown on the epitaxial layer 104, and a nitride layer 116 may be deposited on the oxide layer 114 by chemical vapor deposition (CVD) or similar deposition techniques. Drain recess regions 110 and 112 may be etched through the nitride layer 116, oxide layer 114, and epitaxial layer 104 (for example, using wet chemical etching, gaseous chemical etching, plasma etching, and similar removal techniques).

The middle portion 103 of diagram 100 shows another phase of the fabrication of an example transistor device, where a dielectric oxide layer 122 may be grown over the oxide layer 114 and also grown on the walls of the recess regions 110 and 112 (for example, using low-pressure chemical vapor deposition "LPCVD"). A sidewall shield 118 may be deposited over the dielectric oxide layer 122 and etched along the bottom portions 115 of the recess regions 110 and 112. The recess regions 110 and 112 may be filled (for example, by Plasma-Enhanced CVD "PECVD", Low Pressure CVD "LPCVD", Sub-Atmospheric Pressure CVD "SACVD", Atmospheric Pressure CVD "APCVD", sputter deposition, and the like) with a dielectric material 120. The dielectric layer may be composed of Low Temperature Oxide (LTO), Tetra Ethyl Ortho Silicate (TEOS), High Temperature Oxide (HTO), and the like. Portions of the dielectric oxide layer 122 and the dielectric material 120 may be covered with a planar shield 121 (for example, by plating). The planar shield 121 and the dielectric material 120 filling the drain recess region 112 may be deposited with a pedestal (e.g. TEOS) 124. A portion of the pedestal 124 between the drain recesses 110 and 112 may be etched.

The bottom portion 105 of diagram 100 shows yet another phase of fabrication, where a vertical passivation layer 126, a short vertical gate 128, and an oxide spacer layer 130 may be grown or deposited along the etched walls of the pedestal 124. The diagram also includes a body region 129 that may be a p-type region that is formed by doping a portion of the substrate.

As discussed above, a transistor device (for example, a vertical transistor device) may be formed using a vertical spacer gate, where the vertical spacer gate may be formed on the side of a structure called a pedestal. To reduce the coupling of the spacer gate with the drain region, a shield plate may be formed below the pedestal, which may appreciably reduce the characteristic capacitance (Cgd) between the gate and the drain terminals of the transistor device. Initially, before manufacture processing, an example wafer may include a heavily doped substrate 102 with a lightly doped epitaxial layer 104, where the thickness and doping concentrations of the substrate 102 and the epitaxial layer 104 may be determined by the breakdown voltage requirement. Prior to sealing of the field termination trenches 106, phosphorous doped silicon dioxide glass (phosphosilicate glass) may be deposited and reflowed over the trenches 106 in some examples. The reflowing of the phosphosilicate glass may ensure the field termination trenches are sealed at their top openings prior to subsequent fabrication steps. The body region of the transistor device may be formed by implanting a portion of the substrate, where the body region is to be formed, with a layer of boron aligned to the pedestal using a spacer. The vertical spacer gate and source region may be formed in subsequent steps.

Figure 2:
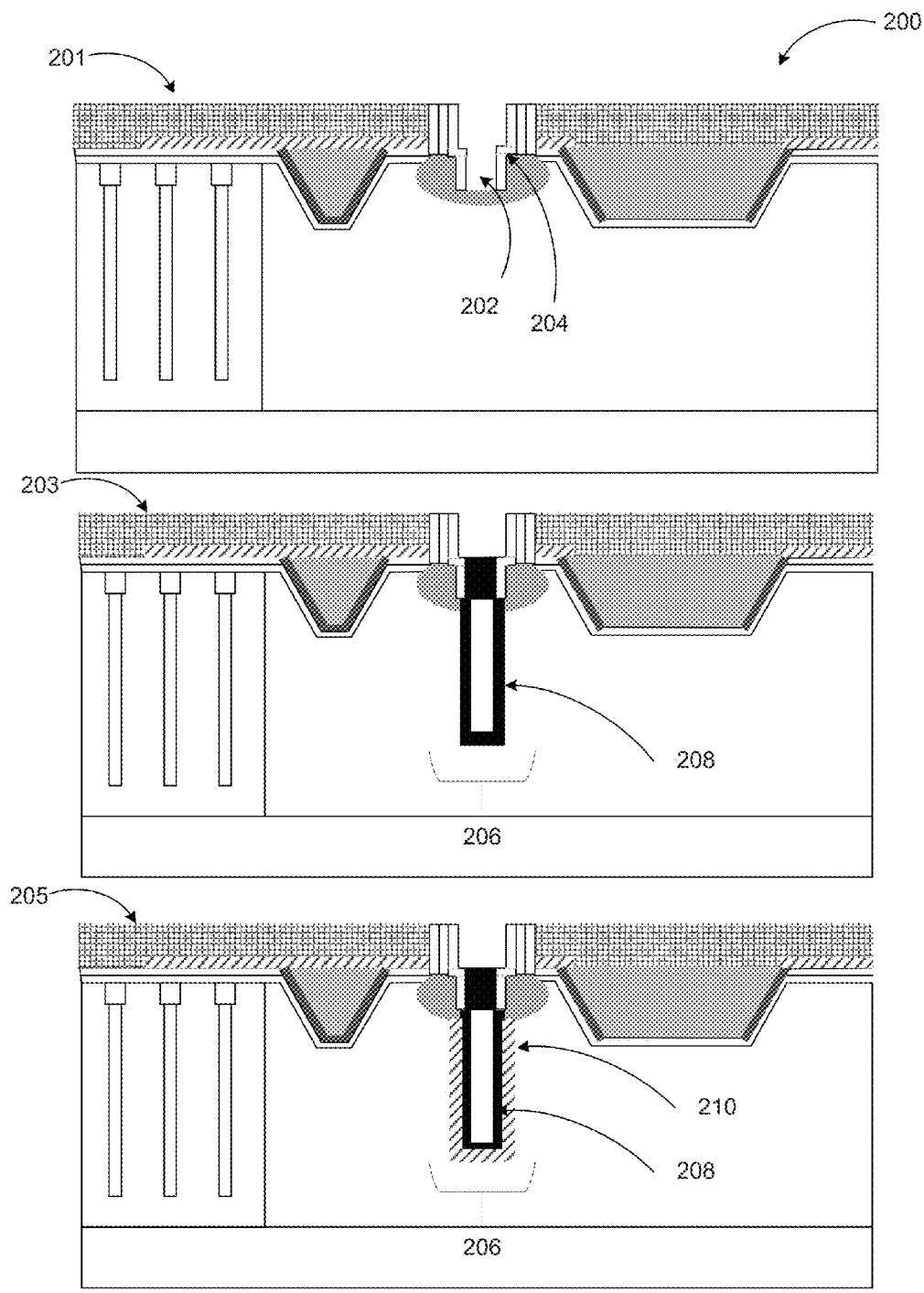
FIG. 2 illustrates side views of three further phases in fabrication of an example transistor device with reduced characteristic on resistance resulting in a trench region with doped sidewalls.

FIG. 2 illustrates side views of three further phases in fabrication of an example transistor device with reduced characteristic on resistance, arranged in accordance with at least some embodiments described herein.

The fabrication phase shown in the top portion 201 of diagram 200 includes a narrow trench region 202 and a thin layer of nitride 204. The middle portion 203 of diagram 200 shows a deep trench region 206 with sidewalls 208. The bottom portion 205 of diagram 200 shows the sidewalls 208 of the deep trench region 206 thinned through etching or similar techniques and a layer of boron doped polysilicon 210 deposited along the sidewalls 208 through CVD, for example.

In some examples, the narrow trench region 202 may be defined by removing the silicon in the source and body regions (for example, by various etching techniques). A depth of the narrow trench region 202 may be maintained above a bottom portion of the diffused body region. The thin layer of nitride 204 may be deposited and then etched, e.g. anisotropically, to form spacers on the sidewalls of the narrow source trench region 202.

Next, the deep trench region 206 may be formed using deep reactive ion etching (DRIE), for example. The depth of the deep trench region may be defined through a computer-aided design system. In some embodiments, after the deep trench region 206 is formed, a short isotropic etch may be performed to form a bottle-like shape in the deep trench region 206, with the nitride spacer forming the neck region (narrow trench region 202). This short isotropic etch may also be utilized to round the corners of the deep trench region 206.

A layer of boron doped polysilicon 210 may be deposited to form a conformal layer in the sidewalls of the narrow deep trench region. The boron doped polysilicon may serve as a source for doping the sidewalls of the deep trench region 206. A drive-in may be used to dope the sidewalls of the narrow deep trench region with boron. The boron doping of the sidewalls of the deep trench may be implemented using LPCVD of polycrystalline doped with Boron trichloride (BCl3). The boron may then be driven into the sidewalls of the trench using a furnace anneal or rapid thermal anneal (RTA) process or a combination of the two processes in a temperature range of about 800 to 1100 degrees Celsius, for example. Also, epitaxial growth of boron doped silicon may also be used for deposition of the p-type dopant and then driven in using furnace anneal, RTA or a combination. The diffusion of the source and body regions may be adjusted according to thermal parameters. The boron-doped deep trench region may be linked to the bottom portion of the body region, while the neck region with the nitride collar may be effective to prevent interaction between the n-type source region and the p-type deep trench region. The thickness of this p-type polysilicon may be adjusted to seal the neck of the bottle-like shaped deep trench leaving an air-gap within a neck section of the bottle-like shaped deep trench, thus enabling expansion due to any thermal expansion effects. The boron doped polysilicon 210 may also be epitaxially grown.

Figure 3:
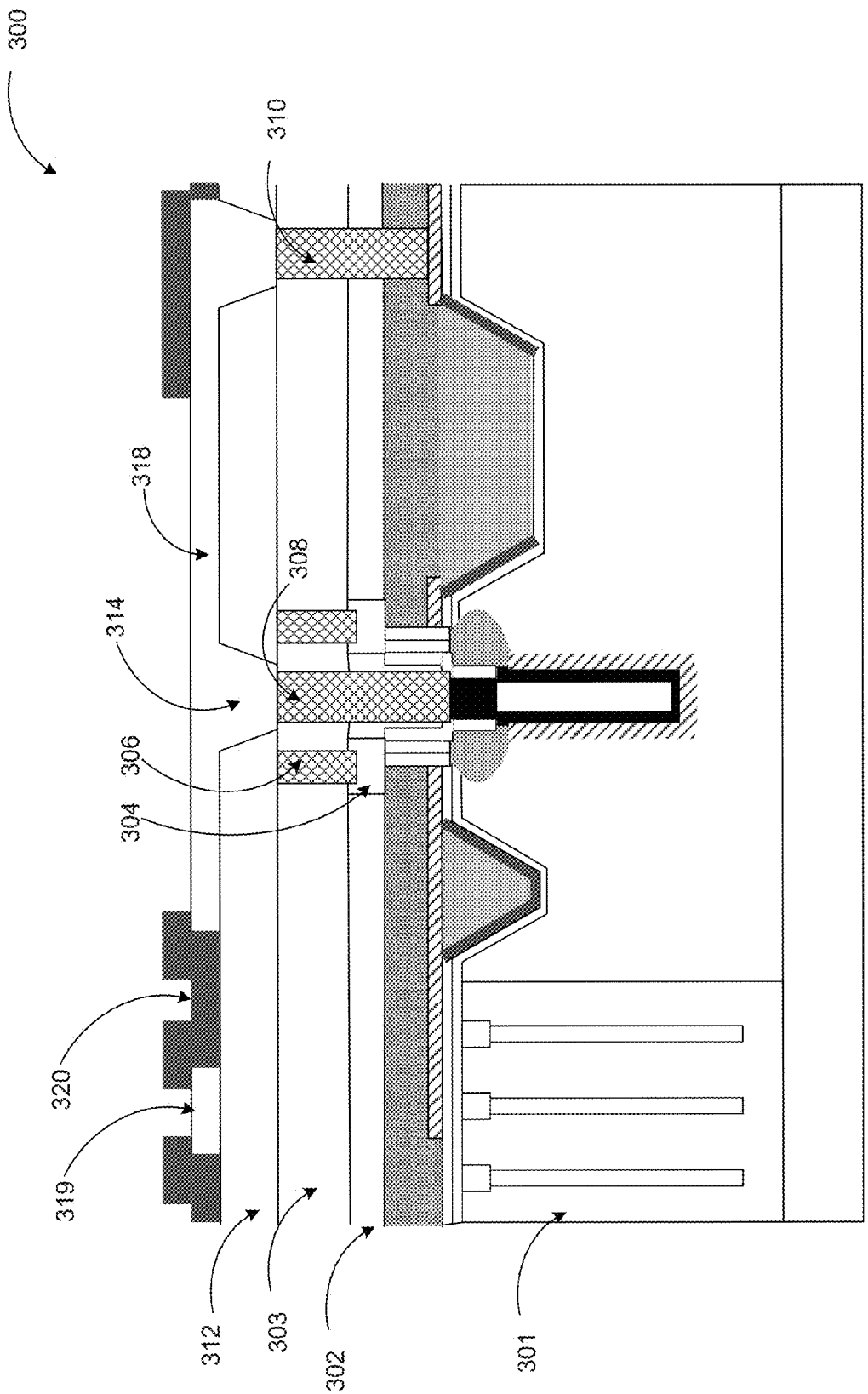
FIG. 3 illustrates a side view of an example transistor device with reduced characteristic on resistance that includes a bottle-shaped trench region with doped sidewalls.

FIG. 3 illustrates a side view of an example transistor device with reduced characteristic resistance that includes a bottle-shaped trench region with doped sidewalls, arranged in accordance with at least some embodiments described herein.

The configuration in diagram 300 includes a planarizing dielectric layer 302 over a pedestal 301, an interlayer dielectric 303, a source contact 308 and a shield contact 310 both extending through the planarizing dielectric layer 302 and the interlayer dielectric 303, and a pair of gate contacts 306 coupled to gate contact refills 304 in the planarizing dielectric layer 302. The configuration may further include a silicon dioxide layer 312 with vias formed for the source and shield regions, such as source via 312, as metal layer 318 over the silicon dioxide layer 312, which may be configured as a contact the source and shield contacts 308 and 310. A portion 319 of the metal layer 318 may be separated from the rest of the metal layer 318 through a passivation layer 320, which is configured as a contact for the gate.

The planarizing dielectric layer 302 may be deposited with a thickness sufficient to refill the source contact opening. The thickness of the planarizing dielectric may depend on the thickness of the pedestal layer 124. A typical thickness of the planarizing dielectric may be in a range of about 1 to 3 microns to fill the opening in the pedestal layer. The planarizing layer may be considered to be sufficient in thickness if the refilled opening in the pedestal layer is substantially planar with the planarizing layer in the regions away from the opening. A planarizing process such as chemical mechanical polishing (CMP) may be used for the planarizing dielectric layer. Gate contact openings (not shown) may be formed in the planarizing dielectric layer 302 and filled with gate contact refills 304. The gate contact refills 304 may be in-situ doped polysilicon. Once the gate contact refills 304 are formed, a blanket etch process may thin the planarizing dielectric layer 302 with the gate contact refills 304. Next, the interlayer dielectric 303 may be deposited over the thinned planarizing dielectric with openings etched or patterned over the gate contact refills 304. Gate, source, and shield contacts may be formed through openings in one or more of the various layers, such as the planarizing dielectric layer 302, the interlayer dielectric 303 layer, and/or the pedestal layer. The contacts may be formed through tungsten plug deposition, for example.

The p-type sidewalls of the deep trench region may be configured to charge compensate for the n-drift region, resulting in reduced characteristic on resistance (compared to conventional transistor devices). The reduction in the on resistance may be in the range of about 10 to 30% for the same die size and a particular breakdown voltage. The reduction in the on resistance and the device capacitances may be in a range of about 10 to 30 percent for the same die size and breakdown voltage. Thus, higher speed operations may be attained with higher voltages.

According to other embodiments, the characteristic on resistance may be reduced by replacing the silicon below the body region with conductive material. A backside of the wafer may be thinned by using a support or carrier wafer on the front side to provide mechanical support, and etching trenches in the substrate silicon and epitaxial silicon below the body region while the wafer is held by the support on the front side. The trenches may be filled with conductive material such as tungsten, tantalum, or similar metals. By forming the conductive trenches below the body region, the effect on the breakdown voltage may be reduced with reduction in the characteristic on resistance. The substrate silicon may also be replaced by a plated layer which may reduce the characteristic on-resistance further. FIGS. 4-7 illustrate examples of additional embodiments.

Figure 4:
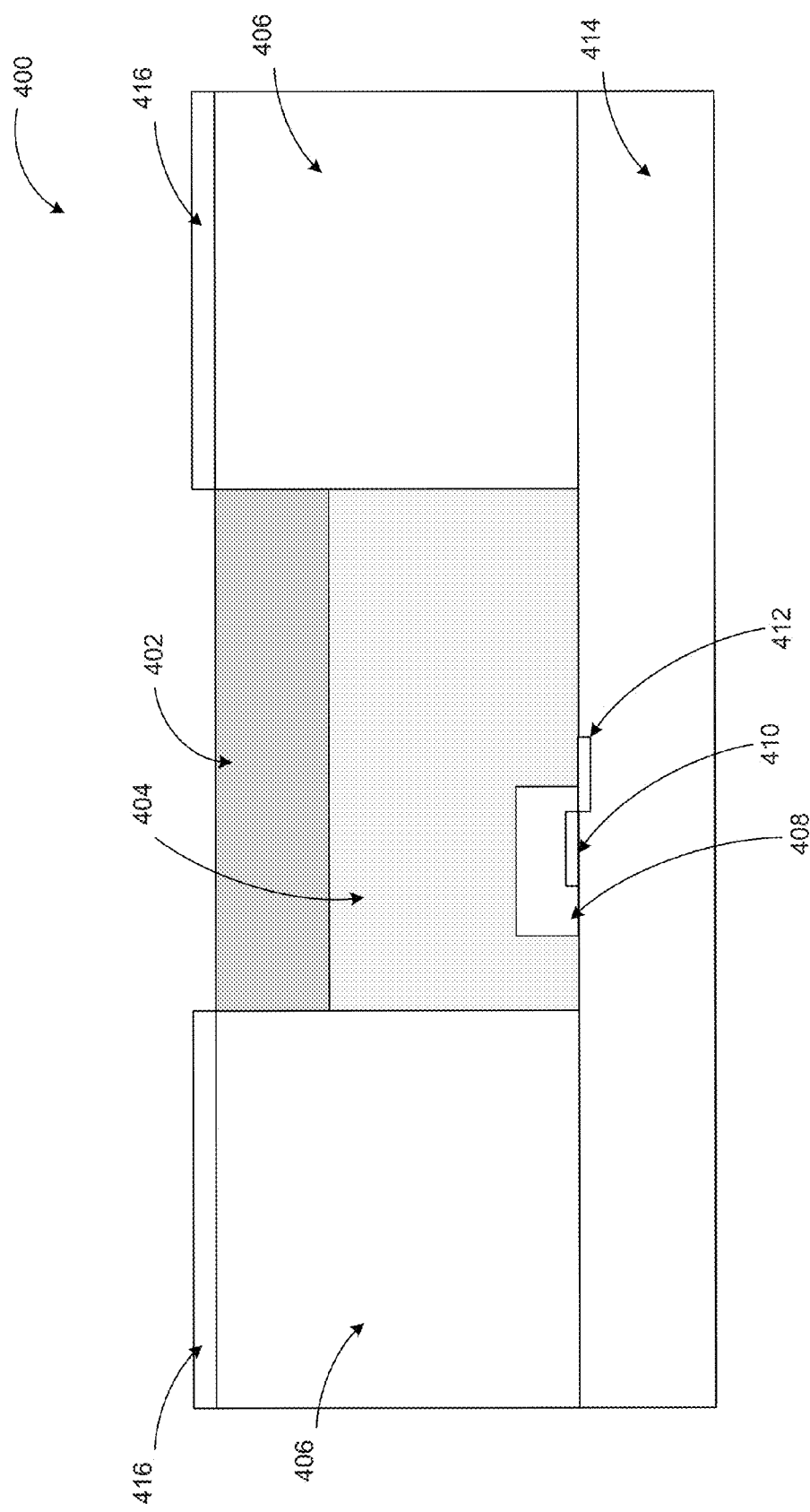
FIG. 4 illustrates a side view of an initial phase in fabrication of an example vertical field effect transistor (FET) device with reduced characteristic on resistance.

FIG. 4 illustrates a side view of an initial phase in fabrication of an example vertical field effect transistor (FET) device with reduced characteristic on resistance, arranged in accordance with at least some embodiments described herein.

The transistor device configuration in diagram 400 includes a carrier wafer 414, an epitaxial layer 404 located on a portion of a surface of the carrier wafer 414, dielectric platform field termination regions 406 located on another portion of the surface of the carrier wafer in a region adjacent to the epitaxial layer 404, and a heavily doped substrate 402 located on the epitaxial layer 404 between the dielectric termination regions 406. Top surfaces of the dielectric platform field termination regions 406 opposite the carrier wafer 414 may be covered with one or more nitride layers 416. A body region 408, a source region 410 within the body region 408, and a gate region 412 may be located in an overlapping portion of the epitaxial layer 404 and the carrier wafer 414 as shown in the diagram.

Fabrication of a device according to the illustrated embodiments of FIG. 4 may begin with formation of dielectric platform field termination regions 406 on a bulk wafer with an epitaxial layer. The starting wafer may comprise a highly doped substrate with an epitaxial layer that is lightly doped. The heavily doped substrate may be doped in a range of about 0.001 to 0.003 ohm*cm, while the lightly doped epitaxial layer may be doped in a range of about 1 to 2 ohm*cm. Thickness and doping concentrations of the epitaxial layer and the substrate may be determined by the breakdown voltage requirement. The dielectric platform field termination regions 406 may configured to terminate electric field lines and may also act as a stop layer for subsequent backside wafer thinning. The source region 410, the body region 408, and the gate region 412 may be formed on a top surface of the epitaxial layer opposite the substrate followed by temporary bonding to the carrier wafer. The body region of the transistor device may be formed by implanting a layer of boron aligned to a pedestal using a spacer, for example. The substrate may be thinned such that the substrate adjacent to the epitaxial layer and the dielectric platform field termination regions are substantially at the same thickness. The carrier wafer may serve to enhance mechanical strength of the wafer for the subsequent fabrication steps. The top surfaces of the dielectric platform field termination regions may be covered with nitride through PECVD deposition and pattern etching, for example.

Figure 5:
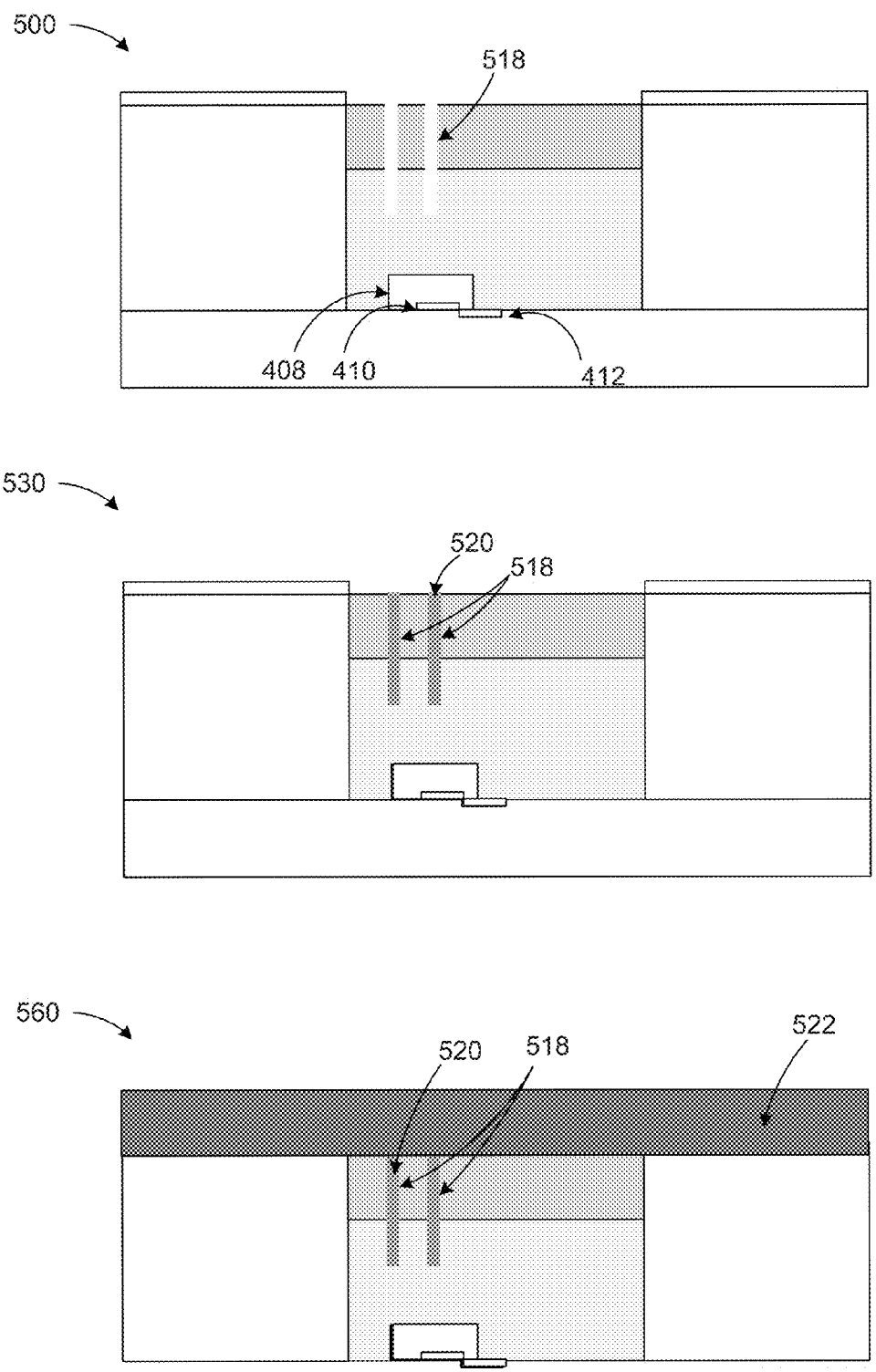
FIG. 5 illustrates side views of further phases in fabrication of an example vertical FET device with reduced characteristic on resistance that includes two trench regions aligned with a body region.

FIG. 5 illustrates side views of further phases in fabrication of an example vertical FET device with reduced characteristic on resistance that includes two trench regions aligned with a body region, arranged in accordance with at least some embodiments described herein.

The transistor device fabrication steps in diagram 500 follow the configuration in diagram 400 and include etched trench regions 518 through the substrate and partially through the epitaxial layer, where the trench regions are substantially aligned with the body region of the transistor device. Diagram 530 includes the example trench regions 518 filled with tungsten, tantalum, or similar highly conductive material 520. Subsequent diagram 560 includes a metal layer 522 deposited or plated over the dielectric platform field termination regions, the substrate, and the trench regions. The carrier wafer is also removed in diagram 560.

Tungsten has resistivity of about 5.6 micro-ohm-cm compared to about 1 milli-ohm-cm of highly doped silicon. The resistivity of tungsten compared to degenerately doped silicon is lower by about three orders of magnitude and may reduce the characteristic on resistance of the vertical transistor device. The placement of the conductive trenches may substantially maintain the breakdown voltage that is sustained between the source/body (the two are coupled) and drain terminals. The metal layer 522 may be Nickel, Copper, or similar metals.

In the above-described configuration, characteristic resistance from the epitaxial layer may be reduced (compared to conventional transistor devices) through the metallized trenches (e.g., tungsten plugs). The metallized trenches may have reduced impact on the breakdown voltage in the depletion region. A depth of the trenches may be selected through a computer-aided design program based on the breakdown voltage. Thus, a high voltage transistor device may be achieved with reduced characteristics on resistance.

Figure 6:
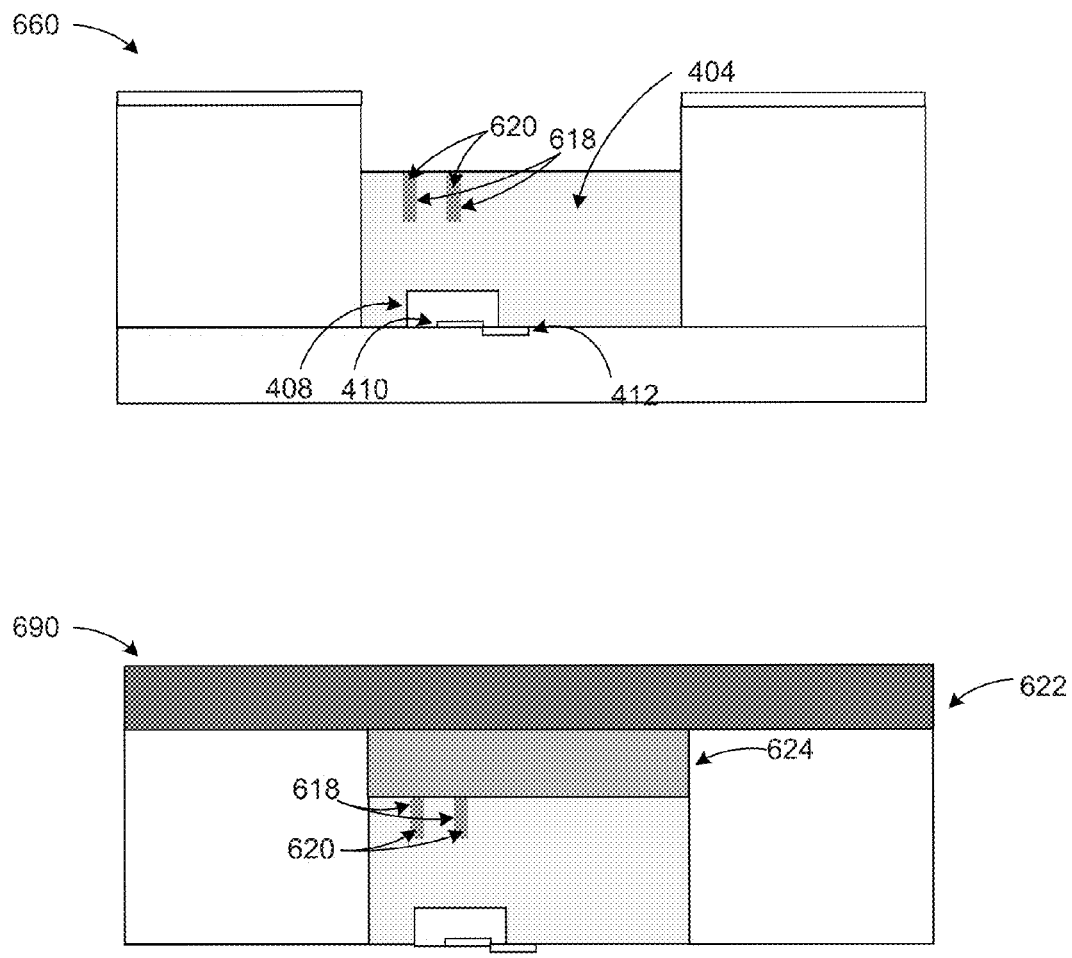
FIG. 6 illustrates side views of further phases in fabrication of an example vertical FET device with reduced characteristic on resistance that includes two trench regions aligned with a body region, where an epitaxial layer is replaced with a metal layer resulting in shorter trench regions.

FIG. 6 illustrates side views of further phases in fabrication of an example vertical FET device with reduced characteristic on resistance that includes two trench regions aligned with a body region, where an epitaxial layer is replaced with a metal layer resulting in shorter trench regions, arranged in accordance with at least some embodiments described herein.

Diagram 660 shows a configuration following the transistor device fabrication step of diagram 530 in FIG. 5. In diagram 660, the heavily doped substrate and portions of the metallized trenches within the substrate are removed (e.g., by etching) leaving the portions 618 of the trenches filled with tungsten, tantalum, or similar highly conductive material 620 in the epitaxial layer substantially aligned with the body region of the transistor device. Diagram 690 shows a subsequent step, where the space left by the removed substrate may be replaced with a metal fill 624 (e.g., copper) and a metal back plate 622 may be deposited over the dielectric platform field termination regions and the metal fill 624. The carrier wafer may also be de-bonded and removed in diagram 690.

The metal back plate 622 may act as the drain of the transistor device in the configuration of diagram 690. The combination of conductive trenches below the body region and the replacement of the substrate silicon with a metal fill region may reduce the characteristic on resistance of the transistor device while still maintaining the high breakdown voltage.

Figure 7:
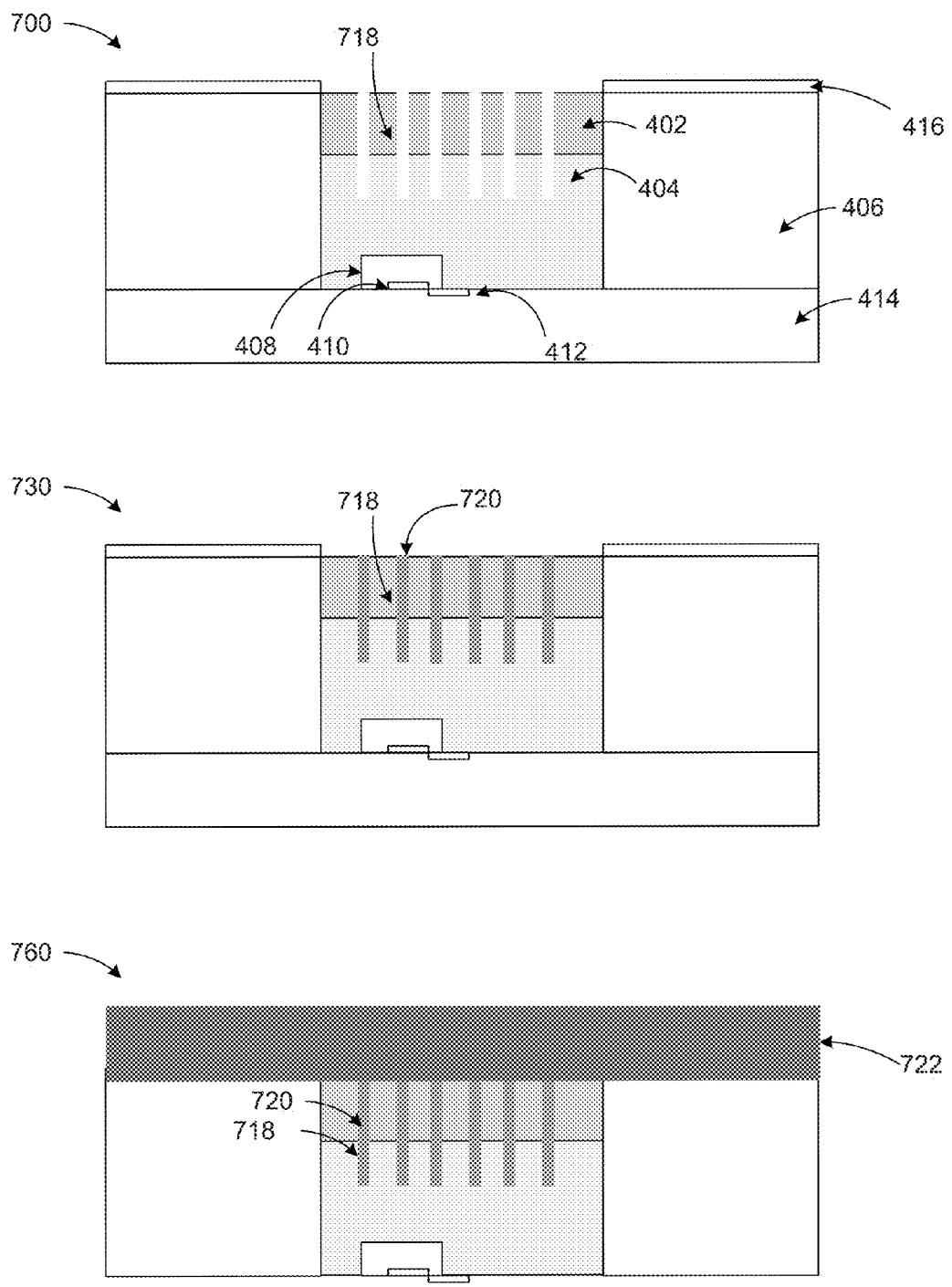
FIG. 7 illustrates side views of phases in fabrication of an example vertical FET device with reduced characteristic on resistance that includes multiple trench regions distributed through the substrate layer.

FIG. 7 illustrates side views of phases in fabrication of an example vertical FET device with reduced characteristic on resistance that includes multiple trench regions distributed through the substrate layer, arranged in accordance with at least some embodiments described herein.

Diagram 700 shows a fabrication phase of a vertical transistor device according to an alternative embodiment and includes a plurality of trench regions 718 etched within the substrate 402 and partially within the epitaxial layer 404. In diagram 730, showing a subsequent fabrication stage, the trench regions 718 may be filled with a highly conductive material 720 such as tungsten or tantalum. In a subsequent fabrication stage shown by diagram 760, the substrate containing the conductively filled trench regions 718 and the dielectric platform field termination regions may be covered by a metal back plate 722 and the carrier wafer may be removed.

In the alternate embodiment illustrated in FIG. 7, the characteristic on resistance contribution from the substrate region may be reduced by use of the highly conductive trench regions. The number of the trench regions may be proportional to a reduction in the resistance. Thus, a higher number of and narrower trenches may be employed for further reduced characteristic on resistance.

Figure 8:
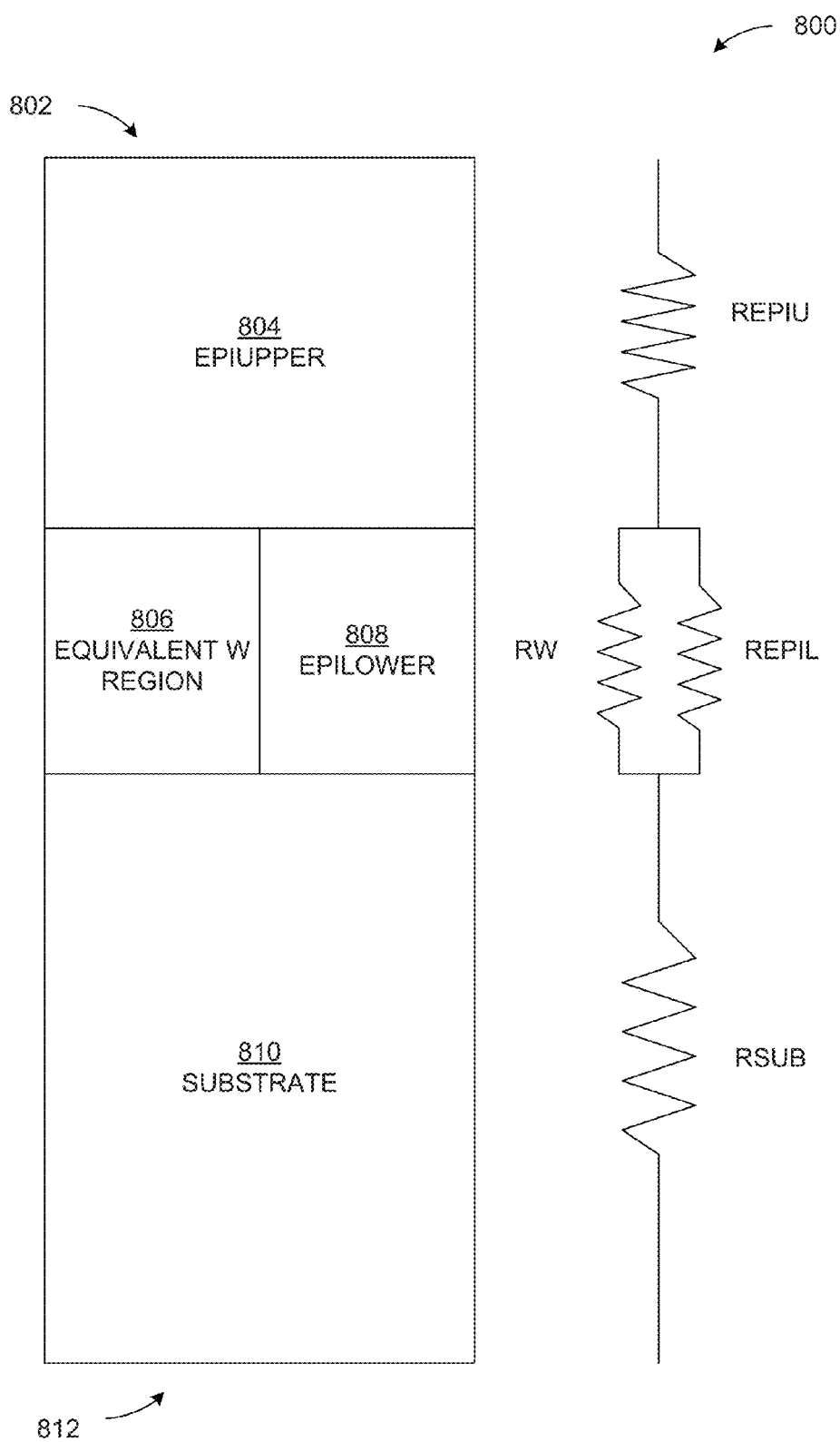
FIG. 8 illustrates a schematic equivalent of an example FET device with reduced characteristic on resistance.

FIG. 8 illustrates a schematic equivalent of an example FET device with reduced characteristic on resistance, arranged in accordance with at least some embodiments described herein.

Diagram 800 is a map view of various physical regions of an example transistor device and characteristic resistances for each physical region in a circuit model representation. The physical regions may correspond to an upper epitaxial region 804, an equivalent tungsten plug region 806 (corresponding to the conductively filled trenches), a lower epitaxial region 808, and a substrate region 810. Each of the regions can be represented in the equivalent resistance model by $R_{EPIU}$, $R_W$, $R_{EPIL}$, and $R_{SUB}$, respectively. A top side 802 of the physical regions may correspond to the source region of the transistor device, while a bottom side 812 of the physical regions may correspond to the drain region of the transistor device.

The total resistance ($R_{TOTAL}$) from the epitaxial layer and the substrate may be approximately modeled as $R_{TOTAL}=R_{EPIU}+R_{EQL}+R_{SUB}$, where $1/R_{EQL}=1/R_{EPIL}+1/R_W$.

With the assumptions that for unit cross-sectional area, A=1, the tungsten plug region (not shown) is one third the length of the total epitaxial region combining the upper epitaxial region 804 and the lower epitaxial region 808 (e.g., a length of about 9 microns for a 100 V breakdown voltage) and the equivalent tungsten plug region 806 below the body is approximately the same width as the epitaxial region (e.g., a width of about two microns) below the channel, then the resistances of the various regions may be given by: $R_{EPIL}=\rho_{EPI}*3$; $R_W=\rho_W*3$; $R_{EQL}=R_{EPIL}*R_W/(R_{EPIL}+R_W)$, where $\rho_{EPI}$ and $\rho_W$ are resistivities of total epitaxial region (804 and 808) and equivalent tungsten plug region 806.

Because the resistivity of tungsten is several orders of magnitude lower than that of heavily doped silicon, $\rho_W \ll \rho_{EPI}$, then $R_W \ll R_{EPIL}$, and the resistances of the various regions may be estimated as $R_{EQL} \sim R_{EPIL}*R_W/(R_{EPIL})$, and $R_{EQL} \sim R_W$. Thus, the addition of the tungsten plugs below the body region may result in a substantially reduced equivalent resistance of the lower epitaxial region.

While the implementations are shown for a vertical transistor device, they may also be used for other high voltage devices such as VMOS transistor device, VDMOS transistor device, etc.

Figure 9:
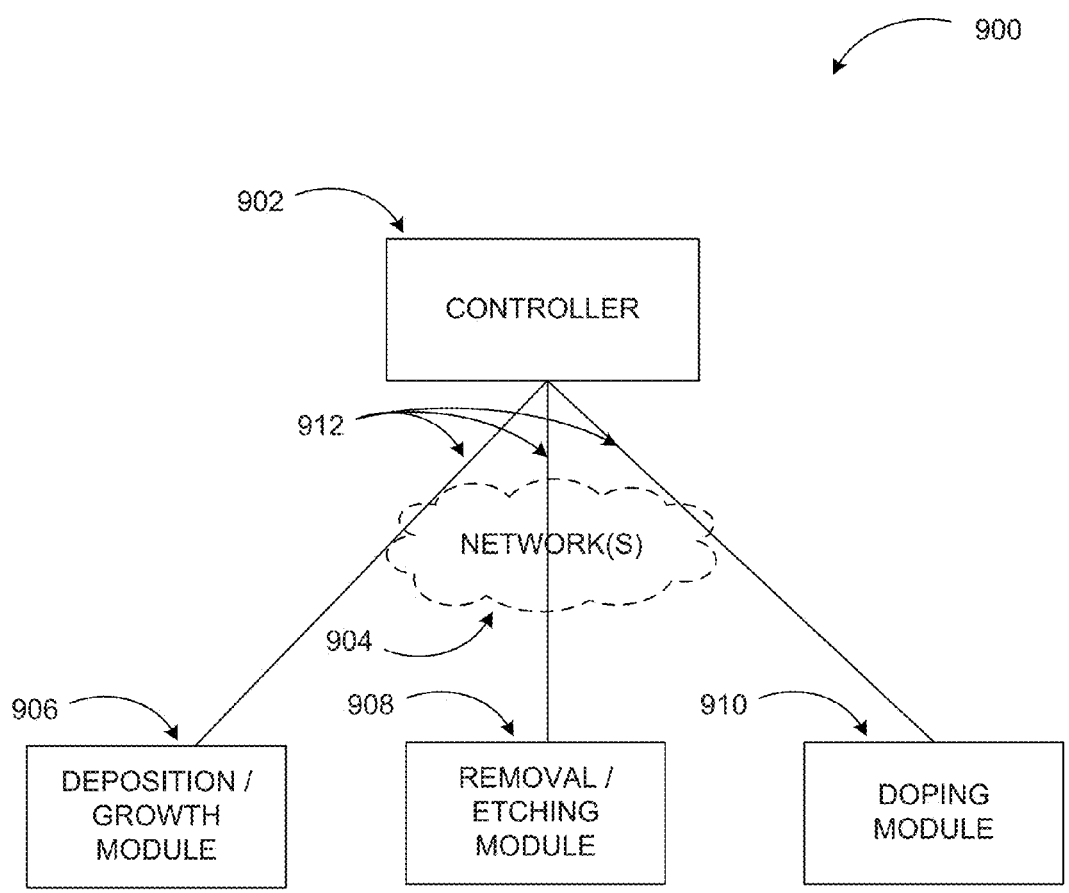
FIG. 9 illustrates an example fabrication system for a vertical FET device with reduced characteristic on resistance.

FIG. 9 illustrates an example fabrication system for a vertical FET device with reduced characteristic on resistance, arranged in accordance with at least some embodiments described herein.

Diagram 900 includes an example fabrication system with a controller 902, a deposition/growth module 906, a removal/etching module 908, and a doping module 910. In some embodiments, the controller 902 may be directly coupled to one or more of the deposition/growth module 906, the removal/etching module 908, and/or the doping module 910 in an integrated fabrication system. In other embodiments, the controller 902 may be a remotely located controller that is communicatively coupled to one or more of the deposition/growth module 906, the removal/etching module 908, and/or the doping module 910. In still other examples, one or more network(s) 904, either wired or wireless, may be configured to provide communicative coupling between the controller 902 and one or more of the deposition/growth module 906, the removal/etching module 908, and/or the doping module 910.

The controller 902 may be configured to coordinate operations of one or more of the deposition/growth module 906, the removal/etching module 908, the doping module 910, as well as other optional modules (not shown) such as a scribing module, an annealing module, and similar ones. In some examples, the controller 902 may coordinate the operation of the various modules via operation of one or more control signals 912. The various control signals 912 may be of a digital format or an analog format, as may be required to interface with the corresponding module. Each signal may be generated (e.g., asserted, de-asserted, pulsed, transmitted/received, communicated, etc.) in response to operation of instructions, in some examples.

The controller 902 may correspond to a software controller, a hardware controller, or a combination thereof. Example controllers may include one or more computers, general purpose processors, special purpose processors, circuits, application specific integrated circuits (ASICs) or combinations thereof. Example processors may include micro-processors, micro-controllers, complex instruction set computer (CISCs) processors, reduced instruction set computer (RISC) processors, or other similar variations thereof. The operation of some controller implementations may include execution of hardware based instructions such as from firmware, software based instructions, hard-wired instructions, or combinations thereof.

The deposition/growth module 906 may be configured (e.g., via one or more control signals 912 from controller 902) to perform various actions such as forming of drain and/or source terminals, gate terminal, dielectric layer, etc. by using various material deposition or growth techniques such as chemical vapor deposition (CVD), atomic layering deposition (ALD), sputter deposition, and similar ones.

The removal/etching module 908 may be configured (e.g., via one or more control signals 912 from controller 902) to perform actions such as thinning of portions of the vertical transistor device, forming of the trench regions, etc. by using techniques such as wet chemical etching, gaseous chemical etching, plasma etching, and similar ones.

The doping module 910 may be configured (e.g., via one or more control signals 912) to perform actions such as forming of the drain and/or source regions, sidewalls of the trenches, etc. by adding impurities into intrinsic materials (e.g., intrinsic or pure silicon material). The result of doping is to change the carrier concentration to yield a material of a desired type (p-type, n-type), based on the number of impurities. Lightly doped materials are extrinsic materials, and heavily doped are degenerate materials.

Embodiments are not limited to the example modules of diagram 900. A system to fabricate a transistor device with reduced characteristic on resistance may include additional or fewer fabrication modules, and some of the operations of the various modules may be combined to be performed by the same modules. In yet other examples, the operations, such as deposition operations, may be split into multiple modules.

Figure 10:
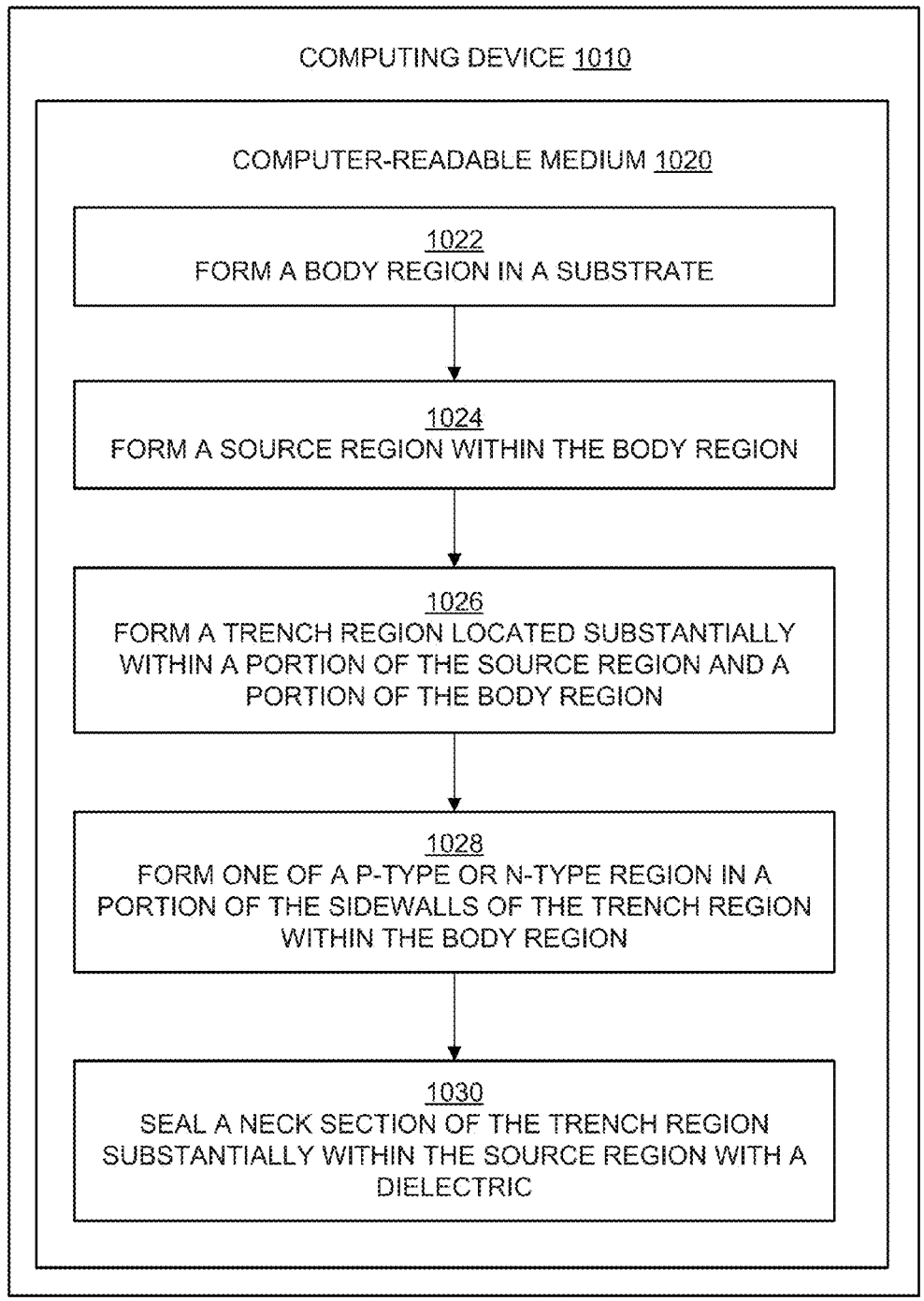
FIG. 10 illustrates a flowchart for a process of fabricating an example transistor device with reduced characteristic on resistance that includes a bottle-shaped trench region with doped sidewalls.

FIG. 10 illustrates a flowchart for a process of fabricating an example transistor device with reduced characteristic on resistance that includes a bottle-shaped trench region with doped sidewalls, arranged in accordance with at least some embodiments described herein.

Example methods may include one or more operations, functions or actions as illustrated by one or more of blocks 1022, 1024, 1026, 1028, and/or 1030, and may in some embodiments be performed by a controller for a transistor device fabrication system. The fabrication system may include a number of modules for various stages of fabrication such as etching, deposition, scribing, etc. Some or all of those modules may be managed by a controller that instructs the respective modules to perform the operations 1022-1030. In some embodiments, the controller may be a computing device such as a desktop computer, a server, a laptop computer, or other forms of computing devices. Thus, the operations described in the blocks 1022-1030 may also be stored as computer-executable instructions in a non-transitory computer-readable medium, such as a computer-readable medium 1020 of a computing device 1010, and may be executable by one or more processors.

A transistor device according to embodiments may be fabricated by the fabrication system using at least one of the semiconductor fabrication techniques selected from the group of CVD, low pressure CVD (LPCVD), atmospheric pressure CVD (APCVD), ultrahigh vacuum CVD (UH-VCVD), ALD, molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

An example process to fabricate a transistor device with reduced characteristic on resistance may begin with block 1022, "FORM A BODY REGION IN A SUBSTRATE." The body region may be formed in the substrate by doping a portion of the substrate lightly with dopants effective to form a body region of a first type (e.g., a p-type or n-type body region). For example a p-type body region may be formed by doping intrinsic silicon with a first material (e.g., Boron, Arsenic, Phosphorous, etc.), and the resulting material may have a carrier concentration of electrons or holes so that it is p-type or n-type depending on the electron-hole concentration.

Block 1022 may be followed by block 1024, "FORM A SOURCE REGION WITHIN THE BODY REGION." A portion of the body region may be doped with additional dopants of the first type effective to form a source region of the same type (e.g., p-type or n-type) within the body region.

Block 1024 may be followed by block 1026, "FORM A TRENCH REGION LOCATED SUBSTANTIALLY WITHIN A PORTION OF THE SOURCE REGION AND A PORTION OF THE BODY REGION." The trench region may be formed by removing portions of the source and body regions, for example, using DRIE or comparable etching techniques.

Block 1026 may be followed by block 1028, "FORM ONE OF A P-TYPE OR N-TYPE REGION IN A PORTION OF THE SIDEWALLS OF THE TRENCH REGION WITHIN THE BODY REGION". The p-type or n-type region of the sidewalls of the trench region may be formed, for example, by applying a boron-type polysilicon to a neck section of the trench region such that the sidewalls of the trench region are coated by the boron-type polysilicon.

Block 1028 may be followed by block 1030, "SEAL A NECK SECTION OF THE TRENCH REGION SUBSTANTIALLY WITHIN THE SOURCE REGION WITH A DIELECTRIC". The neck section may be sealed, for example, by depositing a dielectric layer over a top portion of the trench region, terminating the dielectric layer near the body region, and anisotropically etching the dielectric layer to form spacers in the neck section of the trench region. In some embodiments, an air gap region may be included within the neck section of the trench region that is configured to facilitate thermal expansion.

The blocks included in the above described process are for illustration purposes. Fabrication of a transistor device with reduced characteristic on resistance may be implemented by similar processes with fewer or additional blocks. In some embodiments, the blocks may be performed in a different order. In some other embodiments, various blocks may be eliminated. In still other embodiments, various blocks may be divided into additional blocks, supplemented with other blocks, or combined together into fewer blocks.

Figure 11:
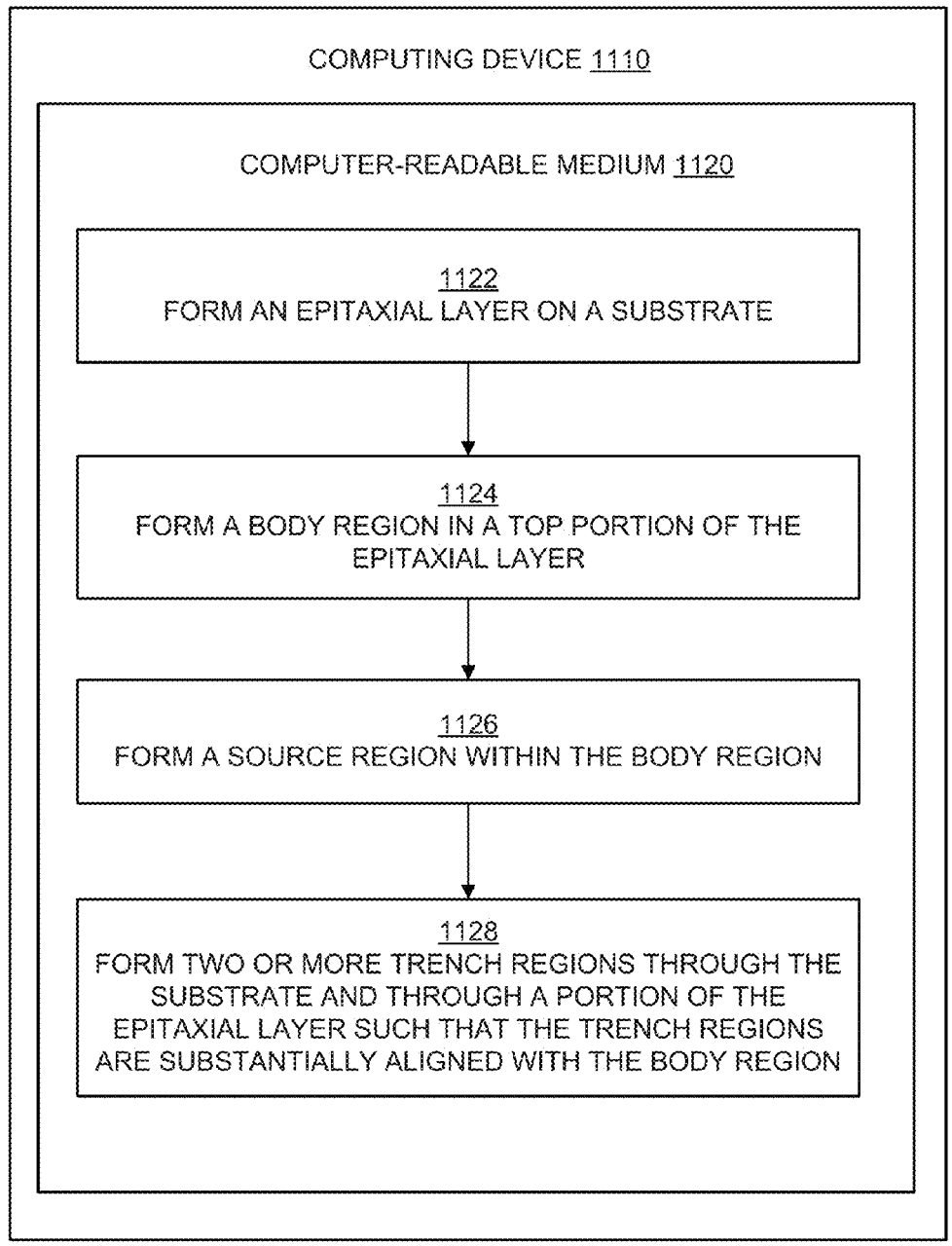
FIG. 11 illustrates a flowchart for a process of fabricating an example transistor device with reduced characteristic on resistance that includes multiple trench region in a substrate layer, all arranged in accordance with at least some embodiments described herein.

FIG. 11 illustrates a flowchart for a process of fabricating an example transistor device with reduced characteristic on resistance that includes multiple trench regions in a substrate layer, arranged in accordance with at least some embodiments described herein.

Example methods may include one or more operations, functions or actions as illustrated by one or more of blocks 1122, 1124, 1126, and/or 1128, and may in some embodiments be performed by a controller for a transistor device fabrication system. The fabrication system may include a number of modules for various stages of fabrication such as etching, deposition, scribing, etc. Some or all of those modules may be managed by a controller that instructs the respective modules to perform the operations 1122-1128. In some embodiments, the controller may be a computing device such as a desktop computer, a server, a laptop computer, or other forms of computing devices. Thus, the operations described in the blocks 1122-1128 may also be stored as computer-executable instructions in a non-transitory computer-readable medium, such as a computer-readable medium 1120 of a computing device 1110, and may be executable by one or more processors.

An example process to fabricate a transistor device with reduced characteristic on resistance using multiple trench regions in a substrate layer may begin with block 1122, "FORM AN EPITAXIAL LAYER ON A SUBSTRATE." The epitaxial layer may be grown over the substrate.

Block 1122 may be followed by block 1124, "FORM A BODY REGION IN A TOP PORTION OF THE EPITAXIAL LAYER." The body region may be formed in the epitaxial layer by doping a portion of the epitaxial layer lightly with dopants effective to form a body region of a first type (e.g., a p-type or n-type body region). For example a p-type body region may be formed by doping intrinsic silicon with a first material (e.g., Boron, Arsenic, Phosphorous, etc.), and the resulting material may have a carrier concentration of electrons or holes so that it is p-type or n-type depending on the electron-hole concentration.

Block 1124 may be followed by block 1126, "FORM A SOURCE REGION WITHIN THE BODY REGION." A portion of the body region may be doped with additional dopants of the first type effective to form a source region of the same type (e.g., p-type or n-type) within the body region.

Block 1126 may be followed by block 1128, "FORM TWO OR MORE TRENCH REGIONS THROUGH THE SUBSTRATE AND THROUGH A PORTION OF THE EPITAXIAL LAYER SUCH THAT THE TRENCH REGIONS ARE SUBSTANTIALLY ALIGNED WITH THE BODY REGION." The trench regions may be formed by removing portions of the substrate and the epitaxial layer, for example, using DRIE or comparable etching techniques.

The blocks included in the above described process are for illustration purposes. Fabrication of a transistor device with reduced characteristic on resistance using multiple trench regions in a substrate layer may be implemented by similar processes with fewer or additional blocks. In some embodiments, the blocks may be performed in a different order. In some other embodiments, various blocks may be eliminated. In still other embodiments, various blocks may be divided into additional blocks, supplemented with other blocks, or combined together into fewer blocks.

According to some examples, a semiconductor device is described. An example semiconductor device may include a substrate having a top portion, a bottom portion, and a height; a body region of a selected type, where the body region is configured in contact with the top portion of the substrate; and a source region configured in contact with the body region. The semiconductor device may further include a drain terminal configured in contact with the bottom portion of the substrate and a trench region located below the body region in the bottom portion of the substrate, where sidewalls of the trench region are of the selected type, and wherein the sidewalls of the trench region are located substantially along the height of the substrate.

According to other examples, the selected type may correspond to either a p-type region or an n-type region. The trench region may be located through the source region and the body region. The trench region may also be located through the source region. The semiconductor device may further include a neck section configured in contact with the source region and the trench region and a dielectric spacer located in the neck section, where the dielectric spacer is configured to substantially prevent interaction between a carrier concentration of the source region and a carrier concentration of the sidewalls of the trench region.

According to further embodiments, the dielectric spacer may be configured to terminate near a bottom portion of the body region. The neck section may be sealed with a dielectric. The semiconductor device may further include an oxide compound or a nitride compound configured to seal the sidewalls of the trench region near the neck section. The trench region may include an air gap region that is configured to facilitate thermal expansion of the trench region. The semiconductor device may also include a boron-type polysilicon configured to coat the sidewalls of the trench region.

According to yet other embodiments, a depth of the trench region may be in a range from about 0.5 micrometers to about 50 micrometers. A width of a body section of the trench region may be in a range from about 1 micrometers to about 4 micrometers. A width of a neck section of the trench region may be in a range from about 0.5 micrometers to about 3 micrometers. The semiconductor device may be a vertical transistor device, a lateral transistor device, an integrated transistor device, or a discrete field effect transistor (FET) device. The semiconductor device may also be a field effect transistor (FET) device, a TrenchFET device, a shielded FET device, a vertical metal-oxide semiconductor (VMOS) transistor device, or a vertical diffusion metal-oxide semiconductor (VDMOS) transistor device.

According to other examples, methods of fabricating a semiconductor device are described. An example method may include forming a body region in a substrate; forming a source region within the body region; forming a trench region located substantially within a portion of the source region and a portion of the body region; forming one of a p-type or n-type region in a portion of the sidewalls of the trench region within the body region; and/or sealing a neck section of the trench region substantially within the source region with a dielectric.

According to some embodiments, the method may include depositing a dielectric layer over a top portion of the trench region, terminating the dielectric layer near the body region, and anisotropically etching the dielectric layer to form spacers in the neck section of the trench region. Forming the trench region may include employing deep reactive ion etching (DRIE) to form the trench region. Sealing the neck section of the trench region may comprise including an air gap region within the neck section of the trench region that is configured to facilitate thermal expansion.

According to further embodiments, sealing the neck section of the trench region may include applying a boron-type polysilicon to the neck section such that the sidewalls of the trench region are coated by the boron-type polysilicon. Sealing the neck section of the trench region may further include using one or more of an oxide compound and/or a nitride compound to seal the neck section. The method may also include replacing a seal of the neck section with a polysilicon material. Forming the p-type or n-type region in the portion of the sidewalls of the trench region may include coating the sidewalls with a boron-type polysilicon material using chemical vapor deposition (CVD) or epitaxially depositing a boron-type silicon material on the sidewalls.

According to yet other embodiments, the method may include removing a polysilicon material from a top portion of a wafer comprising the substrate for a plurality of semiconductor devices and coupling the source region to the body region through silicon etching nitride spacers in the sidewalls of the trench region. The method may also include planarizing a top surface of the wafer with a dielectric material and forming contacts for: the source region, a shield layer, and a gate region; where the shield layer is coupled to the source region and configured to be maintained at a ground potential. The method may further include reducing a thickness of the wafer and metalizing at least a portion of a bottom surface of the wafer, where the portion of the bottom surface of the wafer is associated with a drain region of the semiconductor device.

According to further examples, a semiconductor device is described. An example semiconductor device may include a substrate, an epitaxial layer configured in contact with a top portion of the substrate, a body region configured in contact with a top portion of the epitaxial layer, a source region within the body region, and/or two or more trench regions, where the trench regions are configured to be positioned through the substrate and a portion of the epitaxial layer, and where the trench regions are substantially aligned with the body region.

According to some examples the trench regions may include tungsten or tantalum. The semiconductor may further include a gate region configured to be in contact with the top portion of the epitaxial layer such that the gate region partially overlaps with the body region and a drain region configured to be in contact with a bottom portion of the epitaxial layer. Each of the trench regions may have a depth that is in a range from about 5 micrometers to about 50 micrometers. Each of the trench regions may have a width that is in a range from about 2 micrometers to about 8 micrometers. Each of the trench regions may have a depth in a range from about 5 micrometers to about 50 micrometers.

According to other examples, the semiconductor device may include a plurality of trench regions configured to be located through the substrate and the portion of the epitaxial layer, the plurality of trench regions being distributed through a width of the substrate. A depth of the plurality of trench regions may be in a range from about 5 micrometers to about 50 micrometers. A width of the plurality of trench regions may be in a range from about 2 micrometers to about 8 micrometers. The semiconductor device may be a vertical transistor device, a lateral transistor device, an integrated transistor device, or a discrete field effect transistor (FET) device. The semiconductor device may also be a field effect transistor (FET) device, a TrenchFET device, a shielded FET device, a vertical metal-oxide semiconductor (VMOS) transistor device, or a vertical diffusion metal-oxide semiconductor (VDMOS) transistor device.

According to yet other examples, methods of fabricating a semiconductor device are described. An example method may include forming an epitaxial layer on a substrate; forming a body region in a top portion of the epitaxial layer; forming a source region within the body region; and/or forming two or more trench regions through the substrate and through a portion of the epitaxial layer such that the trench regions are substantially aligned with the body region.

According to some examples, the method may further include filling the trench regions with a conductive material. The method may also include replacing the epitaxial layer with a metal layer after the trench regions are formed and filled with one of tungsten and tantalum. The method may further include forming a gate region on the top portion of the epitaxial layer that partially overlaps with the body region and forming a drain region in the substrate below the epitaxial layer. The method may also include forming a plurality of trench regions through the substrate and through the portion of the epitaxial layer such that the plurality of trench regions are distributed along an axis that coincides with a width of the substrate. Forming the trench regions may include employing deep reactive ion etching (DRIE) to form the trench regions.

There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example as one or more programs running on one or more microprocessors), as firmware, or as virtually any combination thereof, and that designing the circuitry and/or writing the code for the software and/or firmware would be possible in light of this disclosure.

The present disclosure is not to be limited in terms of the particular embodiments described in this application, which are intended as illustrations of various aspects. Many modifications and variations can be made without departing from its spirit and scope Functionally equivalent methods and apparatuses within the scope of the disclosure, in addition to those enumerated herein, will be possible from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that particular functionality is achieved. Hence, any two components herein combined to achieve a particular functionality may be seen as "associated with" each other such that the particular functionality is achieved, irrespective of architectures or intermediate components. Likewise, any two components so associated may also be viewed as being "operably connected", or "operably coupled", to each other to achieve the particular functionality, and any two components capable of being so associated may also be viewed as being "operably couplable", to each other to achieve the particular functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more"

or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A semiconductor device, comprising:
   a substrate having a top portion, a bottom portion, and a height;
   a body region of a selected type, wherein the body region is configured in contact with the top portion of the substrate;
   a source region configured in contact with the body region;
   a trench region located below the body region in the bottom portion of the substrate, wherein:
      sidewalls of the trench region are of the selected type,
      the sidewalls of the trench region are located substantially along the height of the substrate, and
      the trench region is located through one or more of the source region and the body region;
   a neck section configured in contact with the source region and the trench region; and
   a dielectric spacer located in the neck section, wherein the dielectric spacer is configured to reduce interaction between a carrier concentration of the source region and a carrier concentration of the sidewalls of the trench region.

2. The semiconductor device of claim 1, wherein the selected type corresponds to either a p-type region or an n-type region.

3. The semiconductor device of claim 1, further comprising one of an oxide compound and a nitride compound configured to seal the sidewalls of the trench region near the neck section.

4. The semiconductor device of claim 1, wherein the trench region includes an air gap region that is configured to facilitate thermal expansion of the trench region.

5. The semiconductor device of claim 1, wherein the semiconductor device includes one of: a vertical transistor device, a lateral transistor device, an integrated transistor device, a discrete field effect transistor (FET) device, a field effect transistor (FET) device, a trench FET device, a shielded FET device, a vertical metal-oxide semiconductor (VMOS) transistor device, or a vertical diffusion metal-oxide semiconductor (VDMOS) transistor device.

6. The semiconductor device of claim 1, wherein the trench region comprises one of tungsten and tantalum.

7. The semiconductor device of claim 1, further comprising an epitaxial layer having a top portion, the epitaxial layer configured in contact with the top portion of the substrate.

8. The semiconductor device of claim 7, wherein the body region is further configured in contact with the top portion of the epitaxial layer.

9. The semiconductor device of claim 7, further comprising:
   a gate region configured to be in contact with the top portion of the epitaxial layer such that the gate region partially overlaps with the body region; and
   a drain region configured to be in contact with a bottom portion of the epitaxial layer.

10. The semiconductor device of claim 7, wherein the trench region is configured to be positioned through the epitaxial layer.

11. The semiconductor device of claim 1, wherein a depth of the trench region is in a range from about 5 micrometers to about 50 micrometers and a width of the trench region is in a range from about 2 micrometers to about 8 micrometers.

12. A method to fabricate a semiconductor device, the method comprising:
   forming a body region of a selected type and configured in contact with a top portion of a substrate, wherein the substrate has the top portion, a bottom portion, and a height;
   forming a source region configured in contact with the body region;
   forming a trench region located below the body region in the bottom portion of the substrate, wherein:
      sidewalls of the trench region are of the selected type,
      the sidewalls of the trench region are located substantially along the height of the substrate, and
      the trench region is located through one or more of the source region and the body region;
   forming a neck section configured in contact with the source region and the trench region; and
   forming a dielectric spacer located in the neck section, wherein the dielectric spacer is configured to reduce interaction between a carrier concentration of the source region and a carrier concentration of the sidewalls of the trench region.

13. The method of claim 12, wherein forming the trench region comprises:
    employing deep reactive ion etching (DRIE) to form the trench region.

14. The method of claim 12, wherein forming the neck section configured in contact with the source region and the trench region comprises:
    including an air gap region within the trench region that is configured to facilitate thermal expansion; and
    applying a boron-type polysilicon to the neck section such that the sidewalls of the trench region are coated by the boron-type polysilicon.

15. The method of claim 12, wherein forming the neck section configured in contact with the source region and the trench region comprises:
    using one or more of an oxide compound and/or a nitride compound to seal the neck section.

16. The method of claim 12, wherein the trench region comprises one of:
    coating the sidewalls of the trench region with a boron-type polysilicon material using chemical vapor deposition (CVD); and
    epitaxially depositing a boron-type silicon material on the sidewalls.

17. The method of claim 12, further comprising:
    removing a polysilicon material from a top portion of a wafer comprising the substrate for a plurality of semiconductor devices; and
    wherein forming the source region configured in contact with the body region includes coupling the source region to the body region through silicon etching nitride spacers in the sidewalls of the trench region.

18. The method of claim 12, further comprising:
    planarizing a top surface of a wafer with a dielectric material;
    forming contacts for: the source region, a shield layer, and a gate region; wherein the shield layer is coupled to the source region and configured to be maintained at a ground potential;
    reducing a thickness of the wafer; and
    metalizing at least a portion of a bottom surface of the wafer, wherein the portion of the bottom surface of the wafer is associated with a drain region of the semiconductor device.

* * * * *